United States Patent
Wang et al.

(10) Patent No.: US 11,152,331 B2
(45) Date of Patent: Oct. 19, 2021

(54) ELECTRONIC PACKAGE AND METHOD FOR FABRICATING THE SAME

(71) Applicant: Siliconware Precision Industries Co., Ltd., Taichung (TW)

(72) Inventors: Lung-Yuan Wang, Taichung (TW); Feng Kao, Taichung (TW); Mao-Hua Yeh, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/673,078

(22) Filed: Nov. 4, 2019

(65) Prior Publication Data

US 2020/0388591 A1 Dec. 10, 2020

(30) Foreign Application Priority Data

Jun. 5, 2019 (TW) ................................ 108119514

(51) Int. Cl.

| | |
|---|---|
| *H01L 25/065* | (2006.01) |
| *H01L 23/552* | (2006.01) |
| *H01L 23/498* | (2006.01) |
| *H01L 21/48* | (2006.01) |
| *H01L 21/56* | (2006.01) |
| *H01L 25/16* | (2006.01) |
| *H01L 25/00* | (2006.01) |
| *H01L 23/31* | (2006.01) |

(52) U.S. Cl.
CPC ...... *H01L 25/0652* (2013.01); *H01L 21/4853* (2013.01); *H01L 21/56* (2013.01); *H01L 23/3121* (2013.01); *H01L 23/49827* (2013.01); *H01L 23/49833* (2013.01); *H01L 23/552* (2013.01); *H01L 25/16* (2013.01); *H01L 25/50* (2013.01)

(58) Field of Classification Search
None
See application file for complete search history.

(56) References Cited

U.S. PATENT DOCUMENTS

| | | | | |
|---|---|---|---|---|
| 8,351,221 | B2 * | 1/2013 | Siomkos | H01L 25/105 361/818 |
| 9,807,890 | B2 * | 10/2017 | Dang | H01L 23/3135 |
| 2010/0008056 | A1 * | 1/2010 | Ono | H01L 23/5385 361/784 |
| 2012/0182706 | A1 * | 7/2012 | Siomkos | H01L 23/552 361/803 |
| 2014/0355222 | A1 * | 12/2014 | Dang | H05K 3/4007 361/736 |
| 2021/0084747 | A1 * | 3/2021 | Schrems | H05K 1/0204 |

* cited by examiner

*Primary Examiner* — Long Pham
(74) *Attorney, Agent, or Firm* — Mintz Levin Cohn Ferris Glovsky and Popeo, P.C.; Peter F. Corless; Steven M. Jensen

(57) ABSTRACT

An electronic package and a method for fabricating the same are provided. Two packaging modules are stacked on each other. An area that an electronic package occupies a mother board is reduced during a subsequent process of fabricating an electronic product. Therefore, the electronic product has a reduced size.

7 Claims, 8 Drawing Sheets

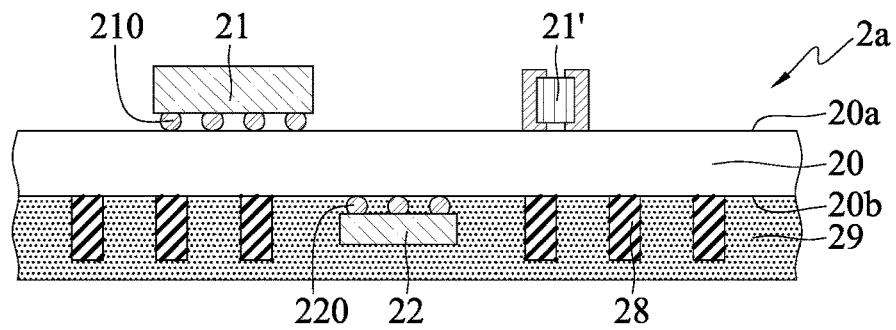
FIG. 2A
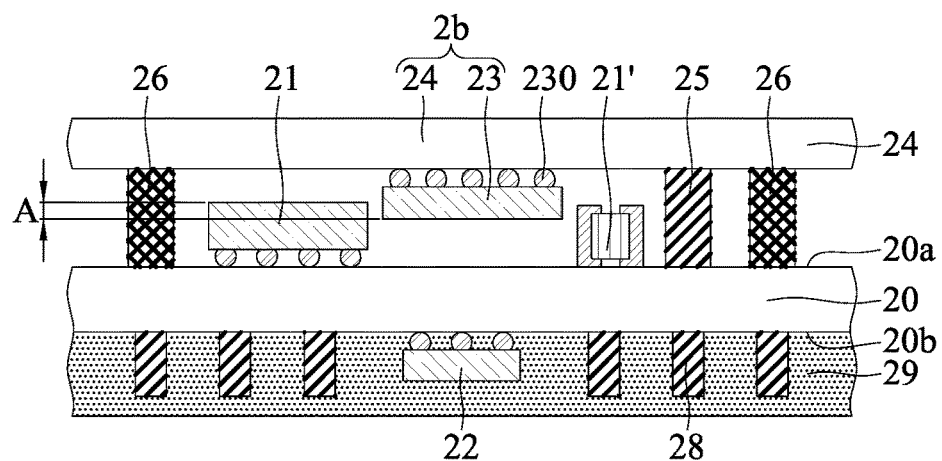
FIG. 2B
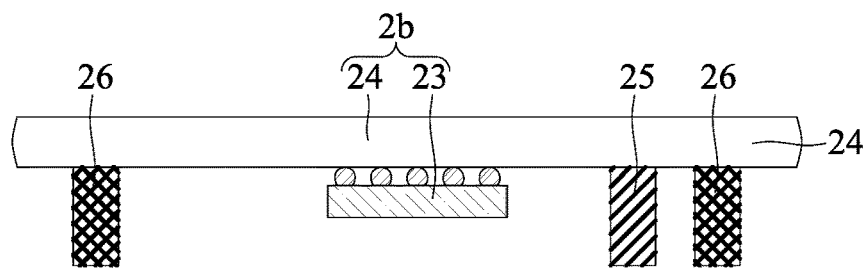
FIG. 2B'
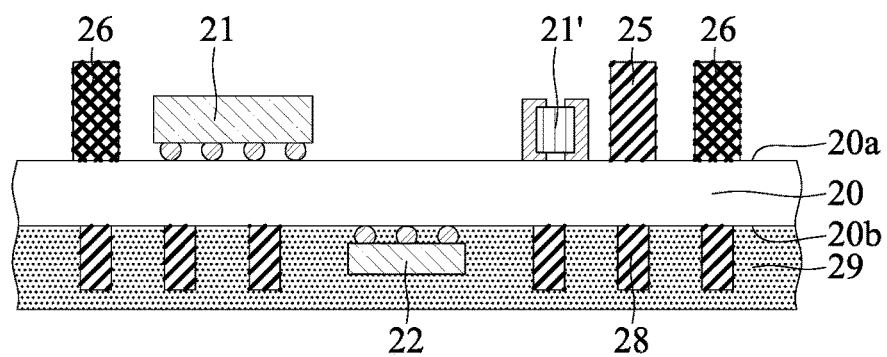
FIG. 2B"

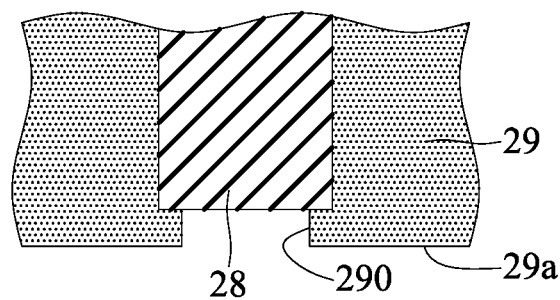
FIG. 2D'
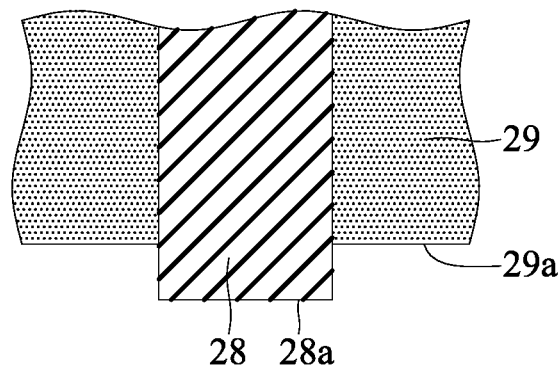
FIG. 2D"

ELECTRONIC PACKAGE AND METHOD FOR FABRICATING THE SAME

CROSS-REFERENCE TO RELATED APPLICATIONS

This application claims priority to Taiwanese Application Serial No. 108119514, filed on Jun. 5, 2019. The entirety of the application is hereby incorporated by reference herein and made a part of this specification.

BACKGROUND

1. Technical Field

The present disclosure relates to semiconductor packaging processes, and, more particularly, to an electronic package having a plurality of packaging modules and a method for fabricating the electronic package.

2. Description of the Prior Art

With the rapid development of portable electronic products, various related electronic products are developed towards high density, compact size and low profile. A variety of semiconductor package structures come to the market, in order to meet the requirements of high density, compact size and low profile.

The more powerful the functions of a portable electronic product are, the larger a number of semiconductor packaging structures that the electronic product needs becomes. Accordingly, a modern semiconductor packaging structure is in the form of multichip module, and integrates two or more semiconductor packages into a single electronic product, to reduce the size of the electronic product and enhance the electrical performance of the electronic product.

As shown in FIG. 1, an electronic product 1 according to the prior art comprises a mother board 10 and a plurality of semiconductor packaging modules 1a and 1b disposed on the mother board 10.

In the electronic product 1 according to the prior art, the semiconductor packaging modules 1a and 1b are disposed on the mother board 10 horizontally, and occupy a large portion of a limited area of the mother board 10. Therefore, another packaging module cannot be disposed on the mother board 10 any longer, or the electronic product 1 has a limited battery capacity. If more packaging modules need to be disposed on the mother board 10, the mother board 10 has to have its surface area increased, which increases the size of the electronic product 1 accordingly.

Therefore, how to overcome the problems of the prior art is becoming an urgent issue in the art.

SUMMARY

In view of the problems of the prior art, the present disclosure provides an electronic package, which comprises: a first carrying structure having a first surface and a second surface opposing the first surface; at least one first electronic component disposed on the first surface of the first carrying structure and electrically connected to the first carrying structure; a plurality of conductors disposed on the second surface of the first carrying structure and electrically connected to the first carrying structure; a second carrying structure stacked on the first surface of the first carrying structure via at least one conductive element electrically connected to the first carrying structure and the second carrying structure; at least one functional electronic component disposed on and electrically connected to the second carrying structure; and a packaging layer formed between the first carrying structure and the second carrying structure and packaging the first electronic component, the functional electronic component and the conductive element.

The present disclosure further provides a method for fabricating an electronic package, the method comprising: providing a first carrying structure having a first surface and a second surface opposing the first surface, with at least one first electronic component disposed on the first surface and electrically connected to the first carrying structure, with a plurality of conductors disposed on the second surface and electrically connected to the first carrying structure; stacking on the first surface of the first carrying structure via at least one conductive element a second carrying structure provided with a functional electronic component electrically connected to the second carrying structure, electrically connecting the conductive element to the first carrying structure and the second carrying structure; and forming a packaging layer between the first carrying structure and the second carrying structure, allowing the packaging layer to pack the first electronic component, the functional electronic component and the conductive element.

In an embodiment, the conductive element is disposed on the second carrying structure first, and then the conductive element is bonded onto the first carrying structure.

In another embodiment, the conductive element is disposed on the first surface of the first carrying structure first, and then the second carrying structure is bonded onto the conductive element.

The present disclosure provides another method for fabricating an electronic package, the method comprising: providing a first carrying structure having a first surface and a second surface opposing the first surface, with at least one first electronic component disposed on the first surface and electrically connected to the first carrying structure, with a plurality of conductors disposed on the second surface and electrically connected to the first carrying structure, and providing a second carrying structure provided with a functional electronic component; disposing at least one conductive element on the first surface of the first carrying structure or the second carrying structure, and forming a packaging layer on the first surface of the first carrying structure or the second carrying structure; and stacking the first carrying structure and the second carrying structure on each other via the conductive element, allowing the packaging layer to be between the first carrying structure and the second carrying structure and to package the first electronic component, the functional electronic component and the conductive element.

In an embodiment, before the stacking of the first carrying structure and the second carrying structure, the conductive element is disposed on one of the first carrying structure and the second carrying structure and the packaging layer is formed on the other of the first carrying structure and the second carrying structure.

In an embodiment, before the stacking of the first carrying structure and the second carrying structure, the conductive element is disposed on one of the first carrying structure and the second carrying structure, and the packaging layer packages the conductive element.

In an embodiment, at least one second electronic component is disposed on the second surface of the first carrying structure and electrically connected to the first carrying structure.

In an embodiment, an encapsulating layer is formed on the second surface of the first carrying structure and encapsulates the plurality of conductors. In another embodiment, a portion of a surface of the conductors is exposed from the encapsulating layer. In yet another embodiment, at least one second electronic component is disposed on the second surface of the first carrying structure and electrically connected to the first carrying structure, and the encapsulating layer further encapsulates the second electronic component. In still another embodiment, a portion of a surface of the second electronic component is exposed from the encapsulating layer.

In an embodiment, the functional electronic component is disposed between the first surface of the first carrying structure and the second carrying structure.

In an embodiment, the functional electronic component and the first electronic component are overlapped.

In an embodiment, a shielding structure is disposed on the first carrying structure or the second carrying structure, and the packaging layer further packages the shielding structure.

It is known from the above that in the electronic package and the method for fabricating the same according to the present disclosure, two carrying structures are stacked on each other. When an electronic product is fabricated in subsequent processes, the space or surface area that the electronic package occupies a mother board is reduced. Compared with the prior art, the electronic package according to the present disclosure allows the mother board to have a space sufficiently large to accommodate other packaging modules or increase the battery capacity, reduces the size of the electronic product advantageously, and allows the electronic product to meet the modern requirements of compact size and low profile.

BRIEF DESCRIPTION OF THE DRAWINGS

FIGS. 2A to 2E are cross-sectional views illustrating a method for fabricating an electronic package of a first embodiment according to the present disclosure.

FIGS. 2B' and 2B" are schematic diagrams of different embodiments of FIG. 2B.

FIGS. 2D' and 2D" are locally schematic diagrams of other embodiments of FIG. 2D.

FIG. 2E' is a locally schematic diagram of another embodiment of FIG. 2E.

FIG. 3A' is a schematic diagram of another embodiment of FIG. 3A.

DETAILED DESCRIPTION

Figure 1:
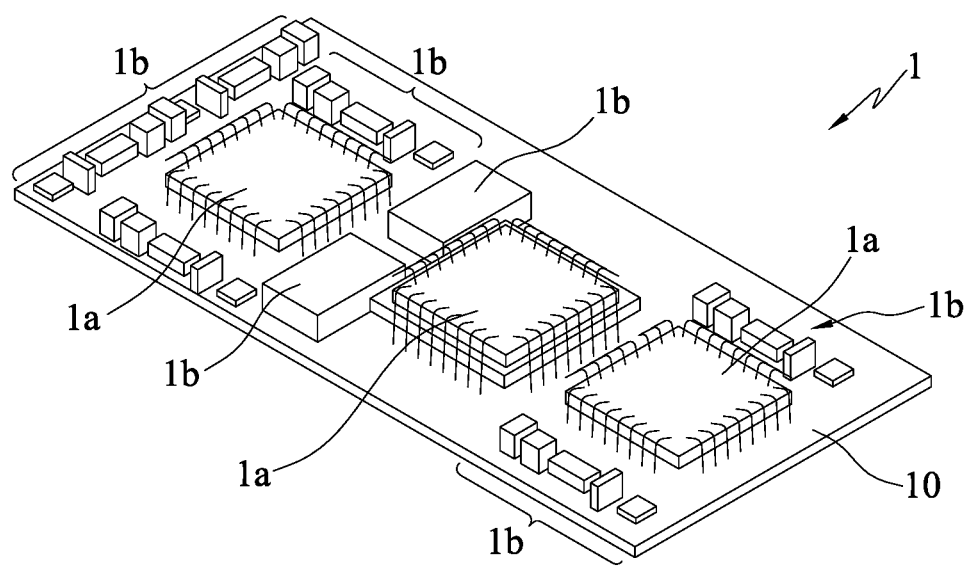
FIG. 1 is a schematic diagram of an electronic product according to the prior art.

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terminologies "first," "second," "a" and the like are for the purpose of describing particular devices and methods only and is not intended to be limiting of this disclosure. Changes or adjustments are considered to be within the scope of the present disclosure, without departing from the scope of the present disclosure.

FIGS. 2A to 2E are cross-sectional views illustrating a method for fabricating an electronic package 2 of a first embodiment according to the present disclosure.

As shown in FIG. 2A, a packaging module 2a is provided that comprises a first carrying structure 20, at least one first electronic component (two first electronic components 21 and 21' are shown in an embodiment), and a plurality of conductors 28. The first carrying structure 20 is in the form of a whole substrate that includes a plurality of substrate units, such as a packaging substrate having a core layer and a circuit structure or a coreless circuit structure. The first carrying structure 20 has a first surface 20a and a second surface 20b opposing the first surface 20a. The circuit structure includes at least one insulating layer and at least one circuit layer bonded to the insulating layer, such as at least one fan out redistribution layer (RDL). It should be understood that the first carrying structure 20 can be a board of other carrying chips, such as a lead frame, a wafer, or a carrying board having metal routing.

In an embodiment, the first carrying structure 20 can be fabricated in a variety of ways. A circuit layer can be fabricated in a wafer fabricating process and silicon nitride or silicon oxide is formed in a chemical vapor deposition (CVD) process to act as an insulating layer. A circuit layer can also be formed in a non-wafer fabricating process, in which a polymer dielectric material of a low cost is used as an insulating layer, such as polyimide (PI), polybenzoxazole (PBO), prepreg (PP), a molding compound, an optically sensitive dielectric layer, or other materials, which is formed by coating.

The first electronic components 21 and 21' are disposed on the first surface 20a of the carrying structure 20.

In an embodiment, the first electronic components 21 and 21' are active elements (denoted by "21"), such as semiconductor chips, passive elements (denoted by "21'"), such as resistors, capacitors and inductors, or a combination thereof. In an embodiment, the first electronic component 21 is a semiconductor chip, and is disposed in a flip-chip manner on a circuit layer of the first carrying structure 20 and electrically connected to the circuit layer via a plurality of conductive bumps 210, such as a solder material, metal pillars, etc. In another embodiment, the first electronic component 21 is electrically connected to the circuit layer of the first carrying structure 20 in a wire bonding manner via a plurality of solder wires. In yet another embodiment, the first electronic component 21 is in direct contact with the circuit layer of the first carrying structure 20. In still another embodiment, the first electronic component 21' is a passive element.

A second electronic component 22, such as an active element, such as a semiconductor chip, a passive element, such as a resistor, a capacitor and an inductor, or a combination thereof, is disposed on the second surface 20b of the carrying structure 20 on demand. In an embodiment, the second electronic component 22 is a semiconductor chip, and is disposed in a flip-chip manner on a circuit layer of the first carrying structure 20 and electrically connected to the circuit layer via a plurality of conductive bumps 220, such as a solder material, metal pillars, etc. In another embodiment, the second electronic component 22 is electrically connected to the circuit layer of first carrying structure 20 in a wire bonding manner via a plurality of solder wires. In yet another embodiment, the second electronic component 22 is in direct contact with the circuit layer of the first carrying structure 20.

Any number or type of electronic components can be disposed on the first surface 20a and the second surface 20b of the first carrying structure 20 on demand, to improve the electric function thereof. In an embodiment, the electronic component can be electrically connected to the carrying structure in various manners.

In an embodiment, the conductors 28 are metal bumps, such as copper pillars, a solder material, metal needles or other conductive structures, and are disposed on the second surface 20b of the first carrying structure 20.

In an embodiment, the conductors 28 are disposed on the second surface 20b of the first carrying structure 20 by patterning, such as metal electroplating, metal depositing and metal etching processes.

An encapsulating layer 29 is formed on the second surface 20b of the first carrying structure 20 and encapsulates the conductors 28. In an embodiment, the encapsulating layer 29 is an insulating material, such as PI, a dry film, or a molding compound such as epoxy, and is formed on the second surface 20b of the first carrying structure 20 by lamination, coating or molding.

As shown in FIG. 2B, another packaging module 2b (which has a second carrying structure 24 provided with at least one functional electronic component 23) is bonded onto the first surface 20a of the first carrying structure 20 via one or a plurality of conductive elements 25.

The second carrying structure 24 is in the form of a whole substrate that includes a plurality of substrate units, such as a packaging substrate having a core layer and a circuit structure or a coreless circuit structure. The circuit structure includes at least one insulating layer and at least one circuit layer bonded to the insulating layer, such as at least one fan out redistribution layer (RDL). It should be understood that the second carrying structure 24 can be a board of other carrying chips, such as a lead frame, a wafer, or a carrying board having metal routing.

In an embodiment, the second carrying structure 24 can be fabricated in a variety of ways. A circuit layer can be fabricated in a wafer fabricating process and a silicon nitride or silicon oxide is formed in a chemical vapor deposition (CVD) process to act as an insulating layer. A circuit layer can also be formed in a non-wafer fabricating process, in which a polymer dielectric material of a low cost is used as an insulating layer, such as polyimide (PI), polybenzoxazole (PBO), prepreg (PP), a molding compound, an optically sensitive dielectric layer, or other materials, which is formed by coating.

The functional electronic component 23 is disposed between the first surface 20a of the carrying structure 20 and the second carrying structure 24. The arrangement of the functional electronic component 23 and the first electronic components 21 and 21' are overlapped. In an embodiment, the functional electronic component 23 has a lateral surface overlapped with a lateral surface of the first electronic component 21, indicated by a lateral surface intersection A.

In an embodiment, the functional electronic component 23 is an active element, such as a semiconductor chip, a passive element, such as a resistor, a capacitor and an inductor, or a combination thereof. In an embodiment, the functional electronic component 23 is a semiconductor chip, and is disposed in a flip-chip manner on a circuit layer of the second carrying structure 24 and electrically connected to the circuit layer via a plurality of conductive bumps 230, such as a solder material, metal pillars, etc. In another embodiment, the functional electronic component 23 is electrically connected to the circuit layer of the second carrying structure 24 in a wire bonding manner via a plurality of solder wires. In yet another embodiment, the functional electronic component 23 is in direct contact with the circuit layer of the second carrying structure 24. It should be understood that any number or type of electronic components can be disposed on the second carrying structure 24 on demand, to improve the electric function thereof. In an embodiment, the electronic component can be electrically connected to the carrying structure in various manners.

The conductive element 25 is electrically connected to the circuit layer of the first carrying structure 20 and the circuit layer of the second carrying structure 24, and can be a metal pillar, such as a copper pillar, a metal bump encapsulated with an insulating bump, a solder ball, a solder ball having a Cu core ball, or any other conductive structure. In an embodiment, the conductive element 25 is a cylindrical pillar, an elliptical pillar or a polygonal pillar.

In an embodiment, the conductive element 25 is formed on the second carrying structure 24 first, and then stacked on and bonded to the first surface 20a of the first carrying structure 20, as shown in FIG. 2B'. In another embodiment, the conductive element 25 is formed on the first surface 20a of the first carrying structure 20 first, and then the second carrying structure 24 is stacked on and bonded to the conductive element 25, as shown in FIG. 2B".

On demand, at least one shielding structure 26 is disposed between the first surface 20a of the first carrying structure 20 and the second carrying structure 24, to prevent electromagnetic waves between multiple first electronic components 21 and multiple functional electronic components 23 from interfering one another and external electromagnetic waves from interfering internal circuits of the first electronic component 21 and the functional electronic component 23.

The shielding structure 26 is disposed on the first surface 20a of the first carrying structure 20 or on the second carrying structure 24, or is secured on the first carrying structure 20 and the second carrying structure 24 by two sides thereof. On demand, the shielding structure 26 is electrically connected to the ground of the first carrying structure 20 and/or the ground of the second carrying structure 24, or is not electrically connected to the first carrying structure 20 and the second carrying structure 24.

Figure 4A:
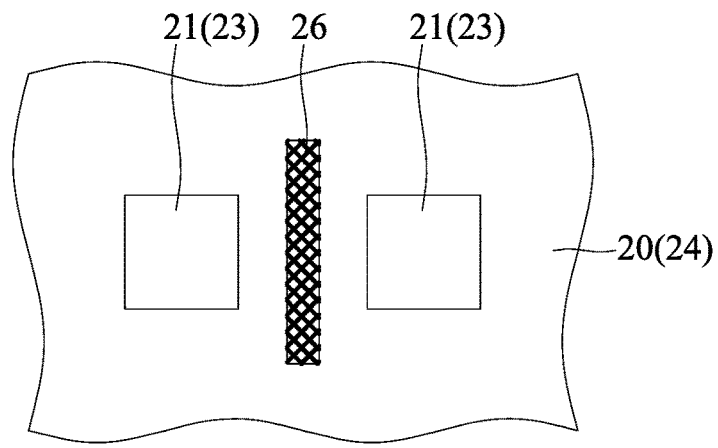
FIGS. 4A to 4C are top views of various arrangement of a shielding structure of an electronic package according to the present disclosure.
Figure 4B:
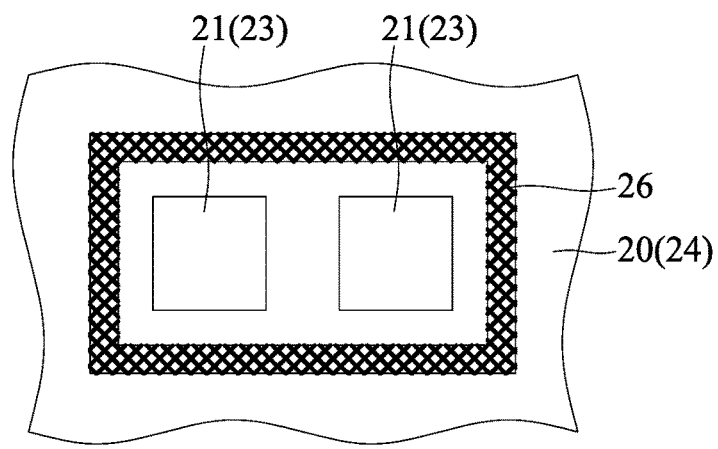
Figure 4C:
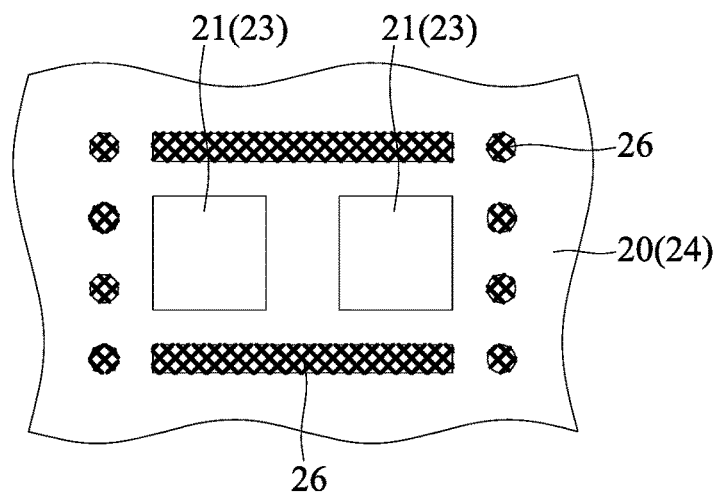

In an embodiment, the shielding structure 26 is in the shape of a frame, a wall or a pillar, is made of a conductive material, such as copper, gold, nickel and aluminum, and is disposed on a carrying structure by adhering, electroplating, depositing or other manners. As shown in FIG. 4A, the shielding structure 26 is disposed among multiple first electronic components 21 or multiple functional electronic components 23. As shown in FIGS. 4B and 4C, the shielding structure 26 is disposed around an area where all of the first electronic components 21 are disposed or around an area where all of the functional electronic components 23 are disposed. It should be understood that the shielding structure 26 can have a variety of structures and can be disposed in various manners.

In an embodiment, the shielding structure 26 and the conductive element 25 are disposed on a same carrying structure, as shown in FIGS. 2B' and 2B". In another embodiment, the shielding structure 26 is disposed individually, and is not disposed on the same carrying structure as the conductive element 25.

Figure 2C:
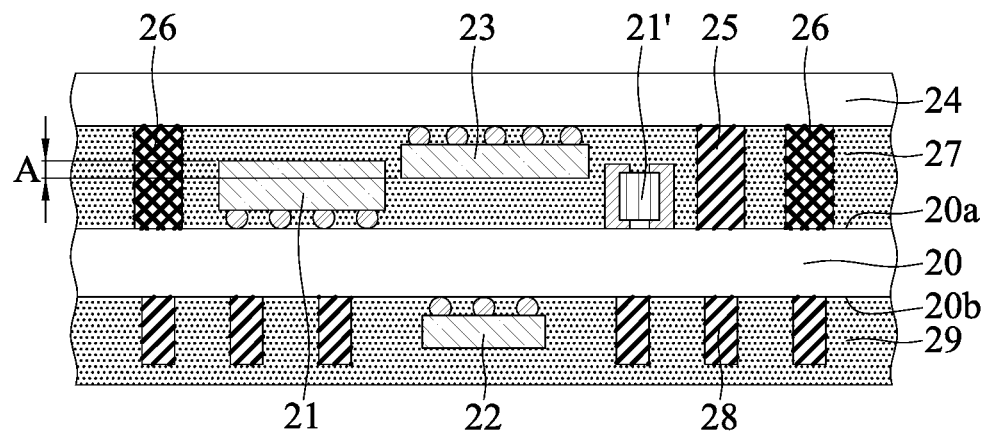

As shown in FIG. 2C, a packaging layer 27 is formed between the first surface 20a of the first carrying structure 20 and the second carrying structure 24 and packages the first electronic component 21, the functional electronic component 23, the conductive element 25, and the shielding structure 26.

In an embodiment, the packaging layer 27 is in contact with the first surface 20a of the first carrying structure 20 and the second carrying structure 24, is made of an insulating material, such as PI or molding compound of epoxy, and is formed by molding.

Figure 2D:
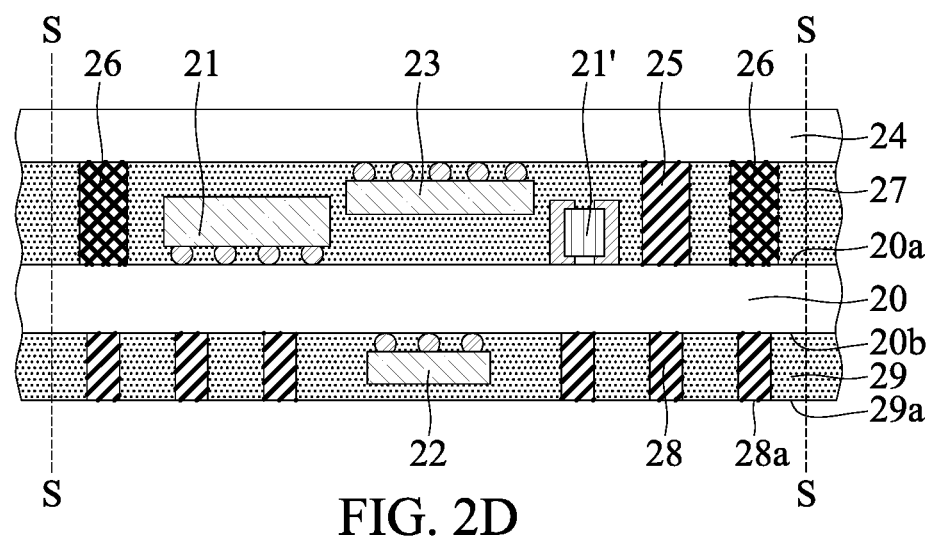

As shown in FIG. 2D, a portion of the encapsulating layer 29 is removed, to expose a portion of a surface of the conductors 28.

In an embodiment, a portion of the encapsulating layer 29 is removed by a leveling process, such as a grinding process, to allow an end surface 28a of the conductors 28 to be flush with a surface 29a of the encapsulating layer 29. In another embodiment, as shown in FIG. 2D', a plurality of openings 290, from which the conductors 28 are exposed, are formed on the surface 29a of the encapsulating layer 29 by a laser drilling process. In yet another embodiment, as shown in FIG. 2D", after the portion of the encapsulating layer 29 is removed, the end surface 28a of the conductors 28 are protruded from the surface 29a of the encapsulating layer 29.

In an embodiment, after the portion of the encapsulating layer 29 is removed, the second electronic component 22 is not exposed from the surface 29a of the encapsulating layer 29. It should be understood that the second electronic component 22 can be exposed from the surface 29a of the encapsulating layer 29 in the same manner as the conductors 28 shown in FIG. 2D, 2D' or 2D".

Figure 2E:
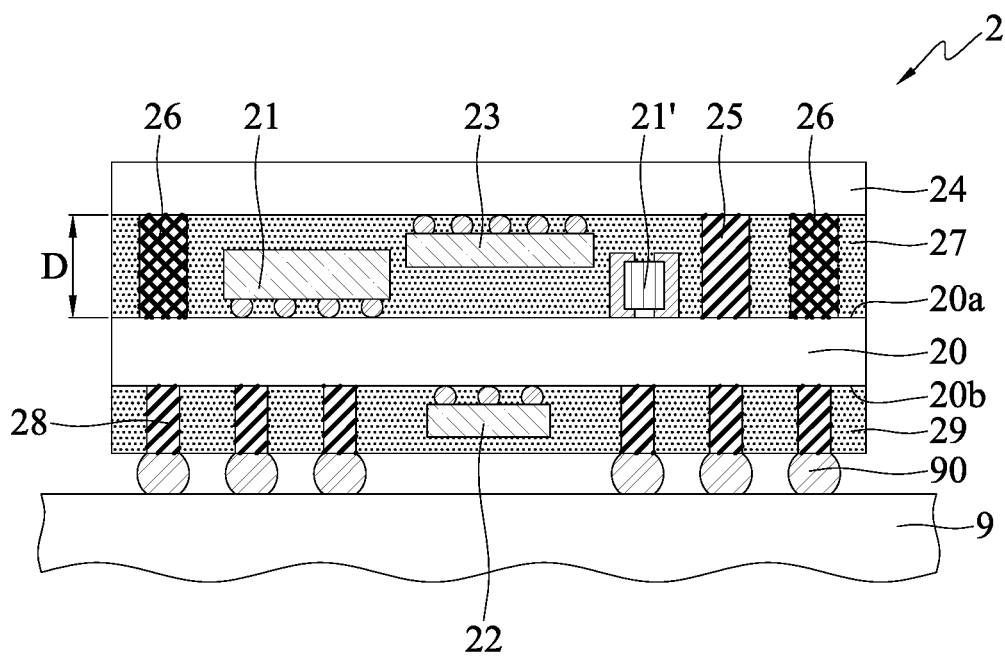
Figure 2E:
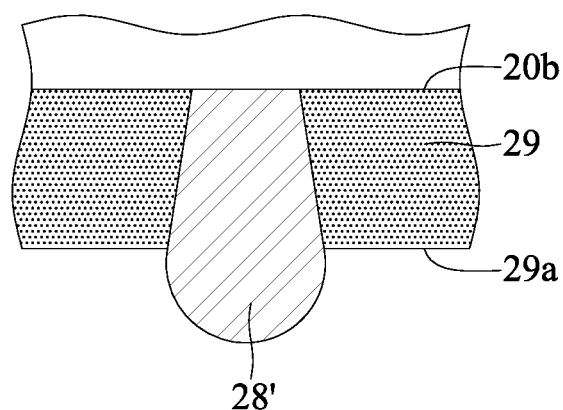

As shown in FIG. 2E, a singulation process is performed along a cutting path S shown in FIG. 2D, and a plurality of electronic packages 2 are obtained.

In an embodiment, the conductors 28 are not made of solder, a plurality of solder bumps 90 are disposed on the exposed end surface 28a of each of the conductors 28, and, after the solder bumps 90 are reflowed, an electronic device 9, such as a circuit board or a mother board, is mounted on the solder bumps 90. In another embodiment, as shown in FIG. 2E', the conductors 28' are made of a solder material, and are reflowed and bonded onto an electronic device 9, such as a circuit board or a mother board.

Figure 3A:
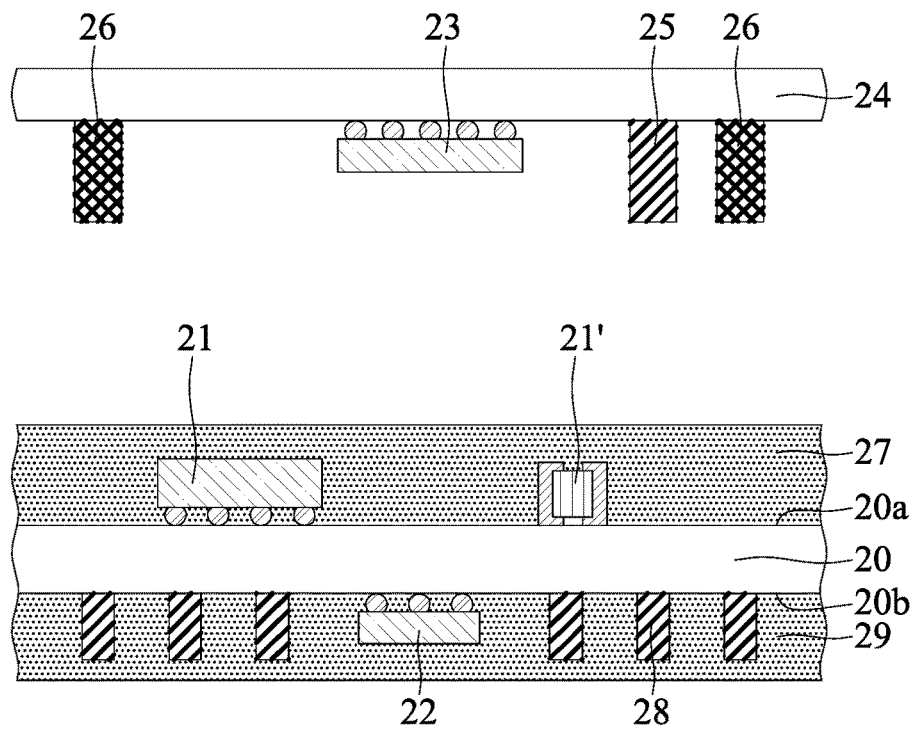
FIGS. 3A to 3C are cross-sectional views illustrating a method for fabricating an electronic package of a second embodiment according to the present disclosure.
Figure 3A:
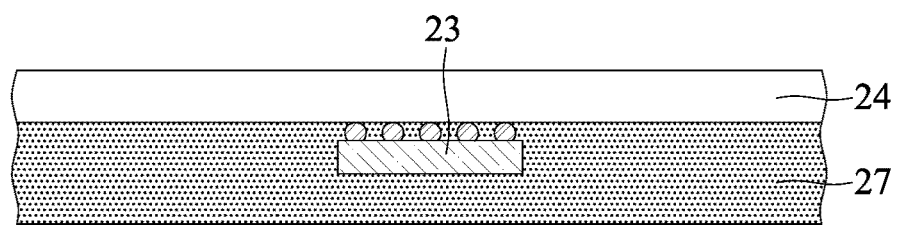
Figure 3A:
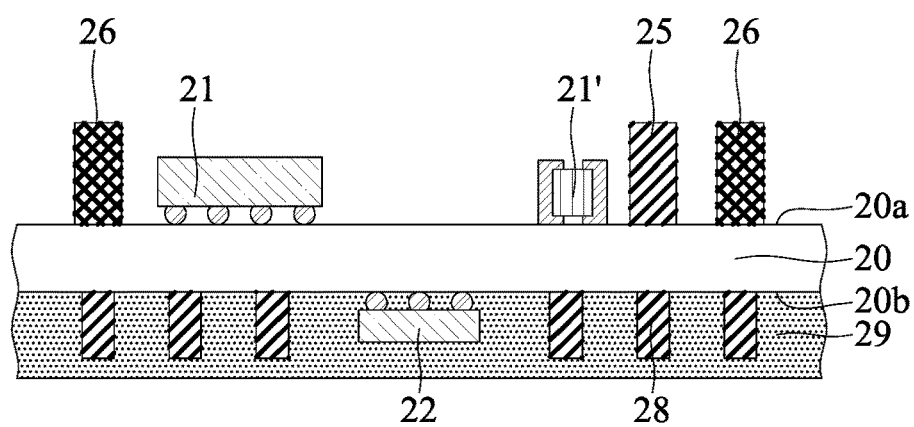
Figure 3B:
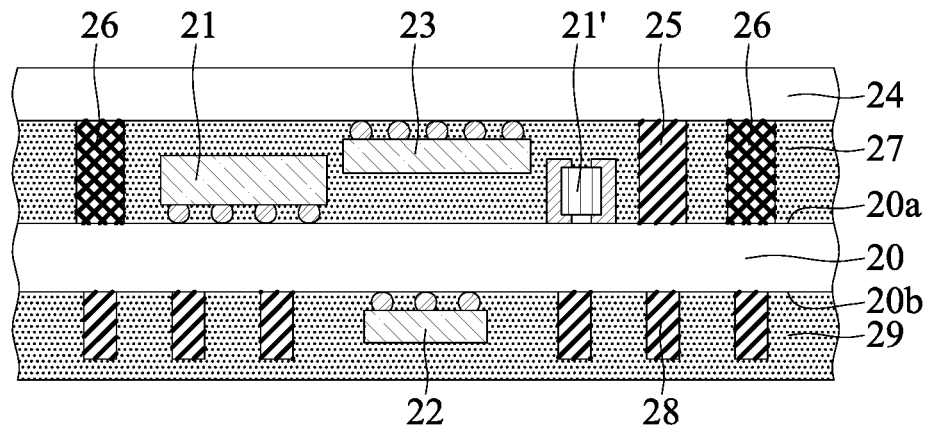
Figure 3C:
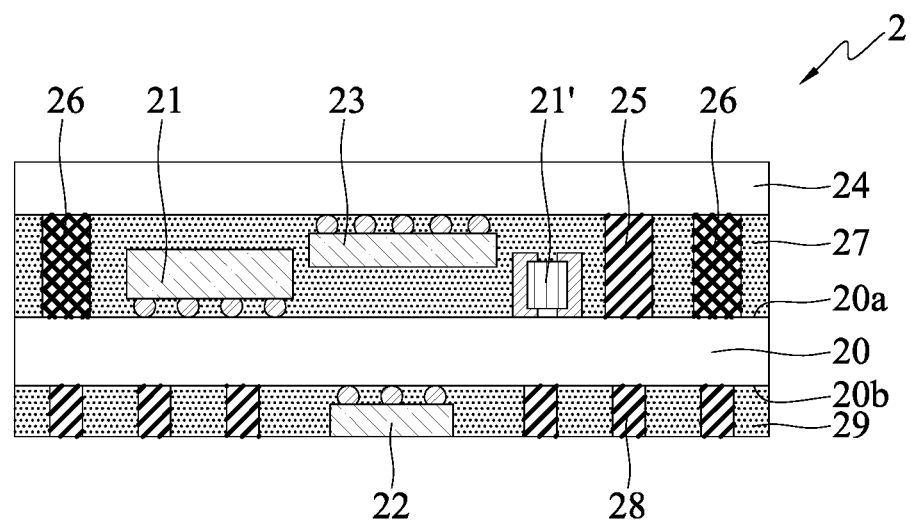

FIGS. 3A to 3C are cross-sectional views illustrating a method for fabricating an electronic package 2 of a second embodiment according to the present disclosure. The second embodiment differs from the first embodiment in how the packaging layer is fabricated.

As shown in FIG. 3A, corresponding to the fabricating process in FIG. 2A, a packaging layer 27 is formed on the first surface 20a of the first carrying structure 20 of the packaging module 2a, and packages the first electronic components 21 and 21'. The stacking method of FIG. 2B' is employed to compress the second carrying structure 24 onto the packaging layer 27, allowing the conductive element 25 and the shielding structure 26 to be inserted into the packaging layer 27, as shown in FIG. 3B.

In an embodiment, the packaging layer 27 is PI, a dry film, or a molding compound such as epoxy, and can be formed by lamination or coating.

In another embodiment, the packaging layer 27 is formed on the second carrying structure 24 and packages the functional electronic component 23, as shown in FIG. 3A'. The stacking method of FIG. 2B" is then employed to compress the second carrying structure 24 via the packaging layer 27 onto the first surface 20a of the first carrying structure 20, and the first electronic components 21 and 21', the conductive element 25 and the shielding structure 26 are inserted into the packaging layer 27, as shown in FIG. 3B. In yet another embodiment, the packaging layer 27 and the conductive element 25 are disposed on a same carrying structure first, and then another carrying structure is compressed onto the packaging layer 27.

As shown in FIG. 3C, the fabricating processes of FIGS. 2D and 2E are performed, allowing the second electronic component 22 to be exposed from the surface of the encapsulating layer 29 and obtain the electronic package 2.

In the electronic package 2 and the method for fabricating the same according to the present disclosure, two packaging structures 2a and 2b are overlapped with each other. With the conductors 28 and 28' as external contacts, when an electronic product is fabricated in subsequent processes, the space or surface area that the electronic package 2 occupies the electronic device 9 is reduced. Compared with the prior art, the electronic package 2 according to the present disclosure allows the electronic device 9 to have a space sufficiently large to accommodate other packaging modules or increase the battery capacity, reduces the size of the electronic product advantageously, and allows the electronic product to meet the modern requirements of compact size and low profile.

In an embodiment, multiple sets of packaging modules 2b are stacked layer-by-layer on the first carrying structure 2a (or multiple sets of second carrying structures 24 provided with functional electronic components 23) on demand.

Since the conductors 28 and 28' act as external contacts, no external contact is required to be disposed on a top surface of the second carrying structure 24 (or the outermost one of the second carrying structures 24).

Since the functional electronic component 23 and the first electronic components 21 and 21' are overlapped, a distance D between the first carrying structure 20 and the second carrying structure 24 is reduced, and the electronic package 2 is thinned.

The present disclosure further provides an electronic package 2, comprising: a first carrying structure 20, first electronic components 21 and 21', a plurality of conductors 28 and 28', a second carrying structure 24, a functional electronic component 23 and a packaging layer 27.

The first carrying structure 20 has a first surface 20a and a second surface 20b opposing the first surface 20a.

The first electronic components 21 and 21' are disposed on the first surface 20a of the first carrying structure 20 and electrically connected to the first carrying structure 20.

The conductors 28 and 28' are disposed on the second surface 20b of the first carrying structure 20 and electrically connected to the first carrying structure 20.

The second carrying structure 24 is stacked via at least one conductive element 25 on the first surface 20a of the first carrying structure 20, and the conductive element 25 is electrically connected to the first carrying structure 20 and the second carrying structure 24.

The functional electronic component 23 is disposed on the second carrying structure 24 and electrically connected to the second carrying structure 24.

The packaging layer 27 is formed between the first surface 20a of the first carrying structure 20 and the second carrying structure 24 and packages the first electronic components 21 and 21', the functional electronic component 23 and the conductive element 25.

In an embodiment, at least one second electronic component 22 is disposed on the second surface 20b of the first carrying structure 20 and electrically connected to the first carrying structure 20.

In an embodiment, an encapsulating layer 29 is formed on the second surface 20b of the first carrying structure 20 and encapsulates the plurality of conductors 28 and 28'. In an embodiment, a portion of a surface of the conductors 28 and 28' is exposed from the encapsulating layer 29. In another embodiment, at least one second electronic component 22 is disposed on the second surface 20b of the first carrying structure 20 and electrically connected to the first carrying structure 20, and the encapsulating layer 29 encapsulates the second electronic component 22. In yet another embodiment, a portion of a surface of the second electronic component 22 is exposed from the encapsulating layer 29.

In an embodiment, the functional electronic component 23 is disposed between the first surface 20a of the first carrying structure 20 and the second carrying structure 24.

In an embodiment, the functional electronic component 23 and the first electronic component 21 are overlapped in position.

In an embodiment, the electronic package 2 further comprises a shielding structure 26 disposed on the first carrying structure 20 or the second carrying structure 24, and the packaging layer 27 further packages the shielding structure 26.

In the electronic package and the method for fabricating the same according to the present disclosure, two carrying structures are overlapped. When an electronic product is fabricated in subsequent processes, the space or surface area that the electronic package occupies a mother board is reduced. Compared with the prior art, the electronic package according to the present disclosure allows the mother board to have a space sufficiently large to accommodate other packaging modules or increase the battery capacity, reduces the size of the electronic product advantageously, and allows the electronic product to meet the modern requirements of compact size and low profile.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
    a first carrying structure having a first surface and a second surface opposing the first surface;
    at least one first electronic component disposed on the first surface of the first carrying structure and electrically connected to the first carrying structure;
    a plurality of conductors disposed on the second surface of the first carrying structure and electrically connected to the first carrying structure;
    a second carrying structure stacked on the first surface of the first carrying structure via at least one conductive element electrically connected to the first carrying structure and the second carrying structure;
    at least one functional electronic component disposed on and electrically connected to the second carrying structure;
    a shielding structure disposed on the first carrying structure or the second carrying structure and connected with the first carrying structure and the second carrying structure; and
    a packaging layer formed between the first carrying structure and the second carrying structure and packaging the first electronic component, the functional electronic component, the shielding structure, and the conductive element.

2. The electronic package of claim 1, further comprising at least one second electronic component disposed on the second surface of the first carrying structure and electrically connected to the first carrying structure.

3. The electronic package of claim 1, further comprising an encapsulating layer formed on the second surface of the first carrying structure and encapsulating the plurality of conductors.

4. The electronic package of claim 3, wherein a portion of a surface of the conductors is exposed from the encapsulating layer.

5. The electronic package of claim 3, further comprising at least one second electronic component disposed on the second surface of the first carrying structure and electrically connected to the first carrying structure, wherein the encapsulating layer further encapsulates the second electronic component.

6. The electronic package of claim 5, wherein a portion of a surface of the second electronic component is exposed from the encapsulating layer.

7. The electronic package of claim 1, wherein the functional electronic component and the first electronic component overlaps with each other.

* * * * *